US011365474B2

(12) United States Patent
Verdyck

(10) Patent No.: US 11,365,474 B2
(45) Date of Patent: Jun. 21, 2022

(54) TERMINATION UNIT

(71) Applicant: ANUMECS BV, Merksem (BE)

(72) Inventor: Dirk Verdyck, Merksem (BE)

(73) Assignee: ANUMECS BV, Merksem (BE)

( * ) Notice: Subject to any disclaimer, the term of this patent is extended or adjusted under 35 U.S.C. 154(b) by 178 days.

(21) Appl. No.: 16/759,869

(22) PCT Filed: Oct. 15, 2018

(86) PCT No.: PCT/EP2018/078124
§ 371 (c)(1),
(2) Date: Apr. 28, 2020

(87) PCT Pub. No.: WO2019/086236
PCT Pub. Date: May 9, 2019

(65) Prior Publication Data
US 2020/0287445 A1    Sep. 10, 2020

(30) Foreign Application Priority Data

Nov. 1, 2017 (BE) .................................. 2017/5791

(51) Int. Cl.
*H02K 11/01* (2016.01)
*C23C 14/34* (2006.01)
(Continued)

(52) U.S. Cl.
CPC ...... *C23C 14/3407* (2013.01); *H01J 37/3435* (2013.01); *H02K 11/014* (2020.08); *C23C 14/35* (2013.01)

(58) Field of Classification Search
CPC .. H02K 11/014; H02K 31/02; H02K 11/0094; H02K 55/06; H02K 7/106; C23C 14/3407; H01J 37/3435; H01J 37/34
See application file for complete search history.

(56) References Cited

U.S. PATENT DOCUMENTS 10,511,200 B2 * 12/2019 Kinjo .................. H02K 3/28
2005/0121992 A1 * 6/2005 Leonov ................ H02K 3/42
310/183
(Continued)

FOREIGN PATENT DOCUMENTS

DE         1613065 A1    12/1970
DE     102013106168 A1 * 12/2014    .......... H01J 37/3414
(Continued)

OTHER PUBLICATIONS

Search Report and Written Opinion from corresponding BE Application No. 201705791, dated May 29, 2018.
(Continued)

*Primary Examiner* — Quyen P Leung
*Assistant Examiner* — Leda T Pham
(74) *Attorney, Agent, or Firm* — Workman Nydegger

(57) ABSTRACT

A termination unit for a deposition system, comprising a device for effecting a function, the device comprising at least one component comprising electrical steel, and at least one shielding element which is electrically conductive. The shielding element is configured so: an effect of a neighboring current on the component comprising electrical steel, which is not contributing to the function of the device, is mitigated, wherein this neighboring current has a first topology; and so an effect of at least one neighboring current having a different topology than the first topology is not significantly mitigated. The device moreover comprises a current transfer means neighboring the at least one component comprising electrical steel, and adapted for guiding a current according to the first topology and for transferring power to a target when mounted on the termination unit.

13 Claims, 12 Drawing Sheets

(51) Int. Cl.
*H01J 37/34* (2006.01)
*C23C 14/35* (2006.01)

(56) References Cited

U.S. PATENT DOCUMENTS

| | | | | |
|---|---|---|---|---|
| 2009/0230806 | A1* | 9/2009 | Miyata | H02K 19/22 |
| | | | | 310/195 |
| 2012/0086288 | A1 | 4/2012 | Tanaka et al. | |
| 2018/0102678 | A1* | 4/2018 | Kusase | H02K 1/14 |

FOREIGN PATENT DOCUMENTS

| | | |
|---|---|---|
| DE | 102013106168 A1 | 12/2014 |
| EP | 3193432 A1 | 7/2017 |
| WO | 2011029647 A2 | 3/2011 |

OTHER PUBLICATIONS

International Search Report and Written Opinion from corresponding PCT Application No. PCT/EP2018/078124, dated Jan. 21, 2019.

* cited by examiner

TERMINATION UNIT

FIELD OF THE INVENTION

The present invention relates to a termination unit for a deposition system. More specifically it relates to a termination unit which is adapted for transferring power to the target it is carrying while being in operation.

BACKGROUND OF THE INVENTION

The technique of material deposition by means of sputtering is known already for many decades. Typically, a plasma is generated in a low pressure chamber in which an inert gas such as Argon, or an active gas such as oxygen or nitrogen is present, and a high voltage is applied between a so called "sputter target" (containing the material to be deposited) and a "substrate" upon which a layer of the sputter material is to be deposited. The Argon atoms are ionized, and the sputter target is bombarded by the Argon ions, so that atoms are freed from the sputter target, and move to the substrate, where they are deposited.

Basically, three kinds of sputter targets are being used: planar circular disk targets, planar rectangular targets, and rotational cylindrical targets.

Typically, three kinds of power source are being used: DC power, AC or pulsed power (e.g. at a frequency of 1 to 100 kHz) and RF power (e.g. at a frequency of 0.3 to 100 MHz). AC power is typically used when the deposited layer is less conductive and RF is typically used when the target material is quite insulating.

The main function of a termination unit in prior art deposition systems is to carry the target and potentially also to rotate the target. The termination unit may for example be a PVD source termination unit. Since PVD deposition is done with a gas at low pressure, the termination unit has to be vacuum tight, also during a possible rotation of the target. PVD deposition refers to a physical vapor phase deposition technique whereby material from a consumption target is deposited on a substrate on which a thin layer is desired to be applied. In such deposition systems the target needs to be powered with an electrical current such that a certain electrical potential is present on the target.

There is therefore a need for termination units which are adapted for transferring power to the target they are carrying.

SUMMARY OF THE INVENTION

It is an object of embodiments of the present invention to provide termination units for a deposition system which are adapted for transferring power to a target.

The above objective is accomplished by a termination unit according to the present invention.

Embodiments of the present invention relate to a termination unit for a deposition system. The termination unit comprises a device for effecting a function. The device comprises: at least one component comprising electrical steel, and at least one shielding element which is electrically conductive and which is configured such that if a neighboring current which has a first topology would be applied, an effect of the neighboring current on the component comprising electrical steel, which is not contributing to the function of the device, is mitigated by a current through the shielding element resulting in a counteracting field in the shielding element. The device moreover comprises a current transfer means neighboring the at least one component comprising electrical steel, wherein the current transfer means is adapted for guiding a current according to the first topology and for transferring power to a target when it is mounted on the termination unit.

The current through the shielding element may be induced by the neighboring current. It is an advantage of embodiments of the present invention that an effect of a neighboring current, on the component comprising electrical steel, that is not contributing to the function of the device, is mitigated. This effect may for example result in energy losses in the component comprising electrical steel which are reduced by mitigating the effect.

It is an advantage of embodiments of the present invention that a more compact termination unit can be created which is suitable for rotating a target and for transferring electrical power to the target. It is thereby advantageous that the varying non-contributing magnetic field generated by the varying current to power the target is significantly reduced by the shielding winding.

In the electrical steel a single or a set of active currents may generate a time varying magnetic flux density that is higher than would be the case in air. Such devices may for example be found in electrical motors or transformers.

If an alternating external current (which may be a sine wave, a square wave, a pulsed wave or which may have any wave shape), not contributing to the operation of the device, is generating a magnetic field in the electrical steel, then this may lead to heating of the electrical steel caused by hysteresis losses and eddy currents.

It is an advantage of termination units according to embodiments of the present invention that they are comprising means for reducing heating of the electrical steel which is induced if a varying magnetic field is present in the electrical steel which is not contributing to the operation of a device (e.g. motor or bearing) of the termination unit.

In embodiments of the present invention the shielding winding is configured such that another neighboring current, which has a different topology than the first topology, can be applied for which the effect on the component comprising electrical steel is not significantly mitigated.

It is an advantage of embodiments of the present invention that at least one other current can be applied, which has a different topology and of which the effect is not significantly mitigated. Thus selective mitigation of the effects is possible and for example only those effects may be mitigated which do not contribute to the operation of the device and/or which result in energy losses in the component comprising electrical steel.

In embodiments of the present invention the shielding element is configured such that when a neighboring varying current would be applied which results in a varying non-contributing magnetic field through the electrical steel, which is not contributing to the function of the device, this neighboring varying non-contributing magnetic field results in a net magnetic flux through the shielding element, and this neighboring varying current results in a current through the at least one shielding element which results in a magnetic field which counteracts the non-contributing magnetic field.

It is an advantage of embodiments of the present invention that by the presence of the shielding element, a potential non-contributing magnetic field, generated by a potential neighboring varying current (e.g. through a neighboring current transfer means), through the electrical steel is smaller than would be the case when no shielding element is present. The reason therefore is that the neighboring current creates an EMF in the shielding element resulting in a current through the at least one shielding element which results in a magnetic field which counteracts the non-contributing magnetic field. This current counteracts and therefore reduces the non-contributing magnetic field. The non-contributing magnetic field may be generated by an external magnetizing current.

It is an advantage of embodiments of the present invention that a specific non-contributing magnetic field is reduced by the presence of the shielding winding. This is achieved by a shielding winding which is configured such that the varying non-contributing magnetic field results in a net magnetic flux through the shielding element. Other magnetic fields which do not result in a net magnetic flux through the shielding element will not be reduced.

It is an advantage of embodiments of the present invention that power losses in the electrical steel, caused by a potential non-contributing magnetic field, can be significantly reduced by introducing the at least one shielding element.

In embodiments of the present invention the at least one shielding element is a shielding winding which circumvents at least a part of the at least one component comprising electrical steel such that a (varying) non-contributing magnetic field, which is not contributing to the operation of the device, results in a net magnetic flux through shielding winding.

In embodiments of the present invention the at least one component comprising electrical steel is adapted for guiding a contributing magnetic field contributing to the function of the device, wherein the at least one shielding element is positioned such that substantially no net magnetic flux through the shielding element originates from the contributing magnetic field.

It is an advantage of embodiments of the present invention that the operation of the device is not significantly or even not affected by the shielding element. This is achieved by arranging the at least one shielding element such that it does not substantially influence the contributing magnetic field.

In embodiments of the present invention the shielding element is a shielding winding. In embodiments of the present invention the at least one shielding winding is positioned such that a surface of one winding is substantially orthogonal to a direction in which the magnetic field is contributing to the operation of the device.

In embodiments of the preset invention the shielding element is configured such that if a varying current is applied to the current transfer means this results in a current through the shielding element. In embodiments of the present invention the shielding element is designed to shield the effect of a varying current through a current transfer means having a specific topology. The shielding element is thereby designed such that at least some other topologies of neighboring currents can still induce a magnetic field in the component comprising electrical steel. It is an advantage of embodiments of the present invention that electrical power can be transferred to an external device without significant heating of the at least one component comprising the electrical steel.

In embodiments of the present invention the transfer means, for transferring power to an external device, crosses a circumference of the component comprising the electrical steel. In embodiments of the present invention the transfer means is adapted for transferring the current in a unipolar direction through the at least one component comprising electrical steel (no return path through the component).

In embodiments of the present invention the transfer means is configured such that the transfer means crosses a circumference of the component comprising the electrical steel, and such that a return path of the transfer means is outside the at least one component comprising electrical steel.

The transfer means is thereby configured such that, if an AC current is applied through the transfer means this implies that a unipolar AC current flows through the at least one component comprising electrical steel. The unipolar current will result in a magnetic field in the electrical steel. It is an advantage of embodiments of the present invention that this non-contributing magnetic field is compensated for by the shielding element.

In embodiments of the present invention the component comprising electrical steel has a toroidal shape, and the at least one shielding element is a shielding winding which is substantially toroidally wound around the at least one component comprising electrical steel.

In embodiments of the present invention the at least one shielding element is a shielding winding which is short-circuited.

In embodiments of the present invention the at least one shielding element is a shielding winding is loaded by an impedance.

In embodiments of the present invention the at least one shielding element is sunken and/or embedded in the at least one component comprising electrical steel.

In embodiments of the present invention this may be a shielding winding. It is an advantage of embodiments of the previous claims that the at least one shielding element does not form a mechanical hindrance in the device and/or for the operation of the device.

It is an advantage of embodiments of the present invention that the at least one shielding element is positioned where the varying non-contributing magnetic fields are expected.

In embodiments of the present invention the device is an electrical motor comprising a stator, and a rotor and wherein the stator and/or the rotor corresponds with the at least one component comprising electrical steel, and wherein the motor is configured such that a current can be applied to the motor resulting in the contributing magnetic field resulting in a torque force between the stator and the rotor such that the motor can rotate the target when mounted.

It is an advantage of embodiments of the present invention that the motor does not suffer significant torque losses by having the at least one shielding element present. Substantially the same torque is achieved with or without the at least one shielding element. The heating of the motor, however, is less with the at least one shielding element.

In embodiments of the present invention the device is a bearing and the component comprising electrical steel corresponds with a ring of the bearing wherein the bearing is adapted for supporting the rotation of a mounted target.

It is an advantage of embodiments of the present invention that if an alternating non-contributing magnetic field is generated through the electrical steel (e.g. by an alternating current through the opening of the bearing), this field is reduced because of the presence of the shielding element.

In embodiments of the present invention the transfer means comprises a central axis through the device.

The central axis may for example be the rotor axis. It is an advantage of embodiments of the present invention that the non-contributing magnetic field in the stator and/or rotor of the motor caused by the alternating current through the central axis is reduced because of the at least one shielding element.

Devices according to embodiments of the present invention may comprise a controller adapted for applying a DC current through the at least one shielding element to generate a non-contributing magnetic field.

It is an advantage of embodiments of the present invention that using the controller it is possible to generate a non-contributing magnetic field which counteracts a non-contributing magnetic field generated by a DC current through the neighboring current transfer means having the first topology. In embodiments of the present invention the controller is adapted for generating such a current to generate a non-contributing magnetic field which counteracts a non-contributing magnetic field generated by a DC current through the neighboring current transfer means.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
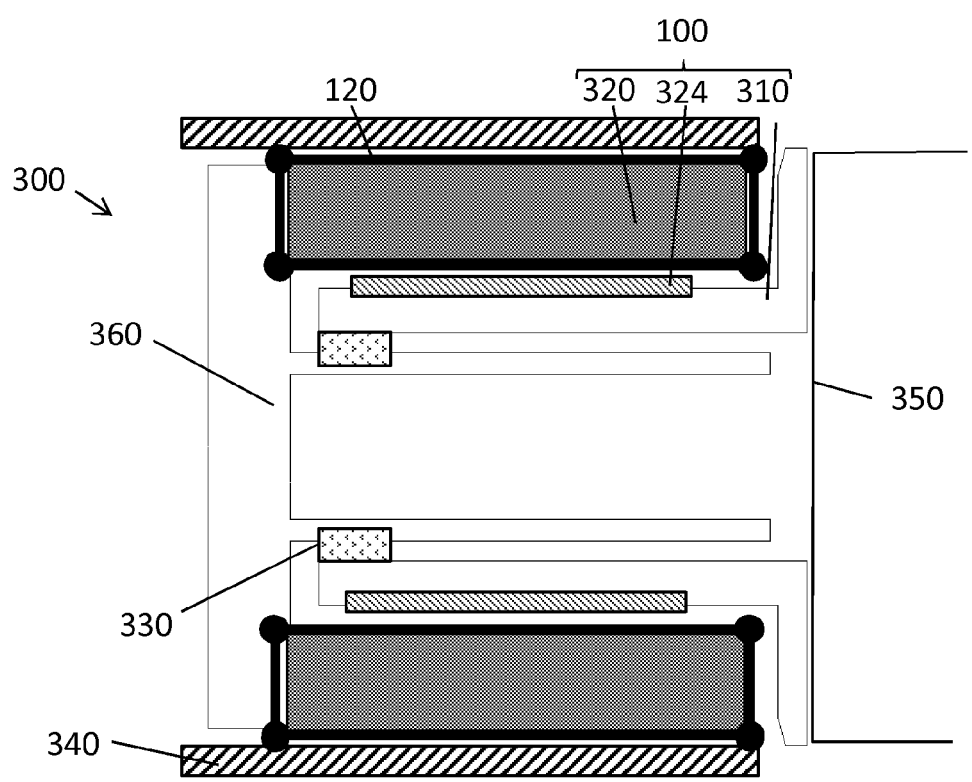
FIG. 1 and FIG. 2 show schematic drawings of a termination unit in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a current which has a certain topology, reference is made to the topology of the conductors carrying the current. Such a carrier may for example go through the circumference of the component comprising the electrical steel.

Embodiments of the present invention relate to a termination unit 300 for a deposition system. The termination unit comprises a device 100 for effecting a function, the device comprising at least one component 110 comprising electrical steel, and at least one shielding element 120 which is electrically conductive and which is configured such that, an effect of a neighboring current on the component 120 comprising electrical steel, which is not contributing to the function of the device, is mitigated, wherein this neighboring current has a first topology, and such that an effect of at least one neighboring current having a different topology than the first topology is not significantly mitigated.

The device moreover comprising a current transfer means 140 neighboring the at least one component 110 comprising electrical steel, wherein the current transfer means is adapted for guiding a current according to the first topology and for transferring power to a target when it is mounted on the termination unit.

A schematic drawing of an exemplary termination unit in accordance with embodiments of the present invention is shown in FIG. 1. A termination unit 300 connects a target 350, in a deposition system, with the outside of the deposition system. Such a termination unit 300 is typically mountable as a part of the deposition system. In parts of the termination unit the pressure can be higher than in the deposition system. This pressure can for example be close to the atmospheric pressure. Parts which can be removed together with the target, or the removable magnet configuration, are typically not considered as part of the termination unit.

The main function of the termination unit 300 is to carry the target and potentially also to rotate the target.

Termination units according to embodiments of the present invention are comprising a transfer means for transferring power to the target when it is mounted onto the termination unit. Thereby power may be transferred from the static part 360 of the termination unit to the rotating part 310 of the termination unit. In the example of FIG. 1 this is achieved through brushes 330. The central axis of the motor may for example be part of the transfer means and may be used for carrying the electrical current towards the target. In the example of FIG. 1 the rotor 310 is used as part of the transfer means for carrying current to the target 350. The figure also shows a magnet configuration 324 on the rotor, a stator 320, a shielding winding 120 around the stator 320 and a housing 340.

Figure 2:
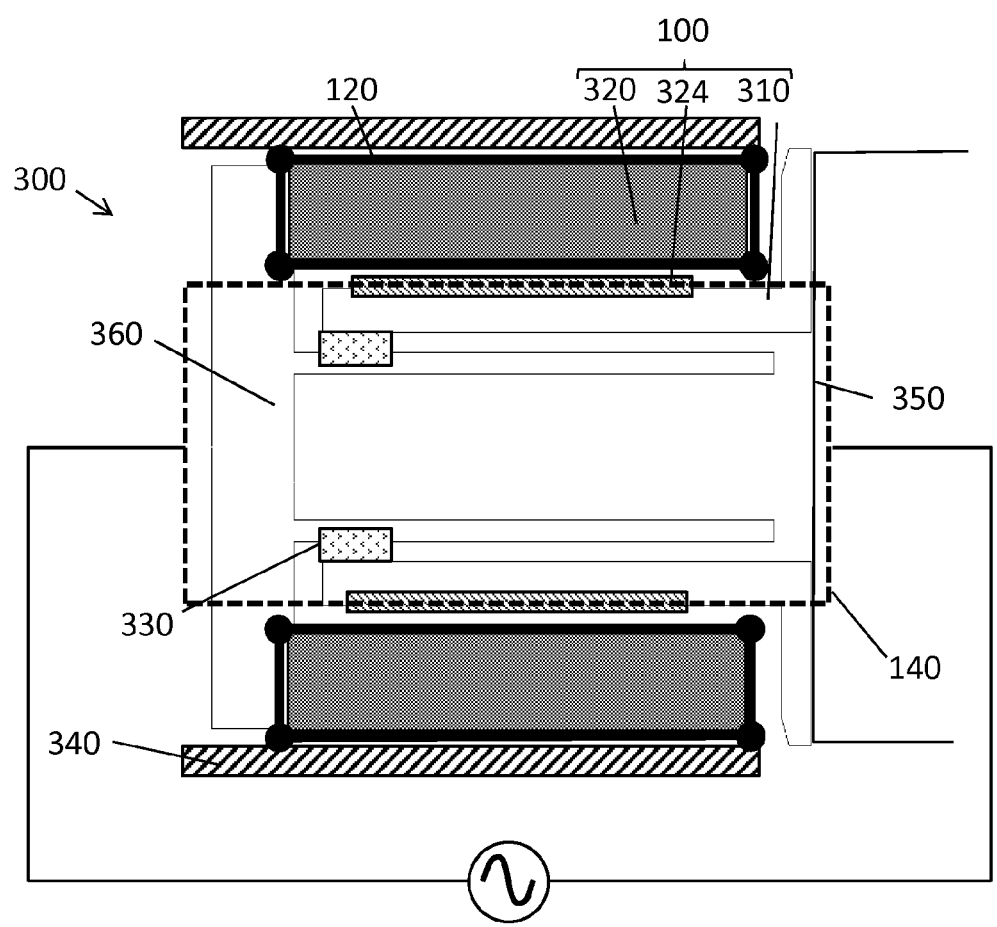

FIG. 2 shows a schematic drawing of the same termination unit as the termination unit in FIG. 1. In this figure the current transfer means 140 is indicated by the dashed line. It comprises the static part 360 of the termination unit, the brushes 330, and the rotating part 310 which is connected with the target 350. FIG. 2 also shows a wiring scheme for closing the current loop. The (unipolar) current transfer forms a closed circuitry around the component comprising electrical steel.

It is an advantage of embodiments of the present invention that the motor of the termination unit 300 comprises a shielding winding 120 which is configured such that an alternating non-contributing magnetic field, originating from an alternating current in the transfer means (e.g. the axis of the motor), results in a current through the shielding winding. Thereby the heating of the electrical steel in the rotor is reduced. This is especially the case when the current is transported through the motor axis 310.

Figure 5:
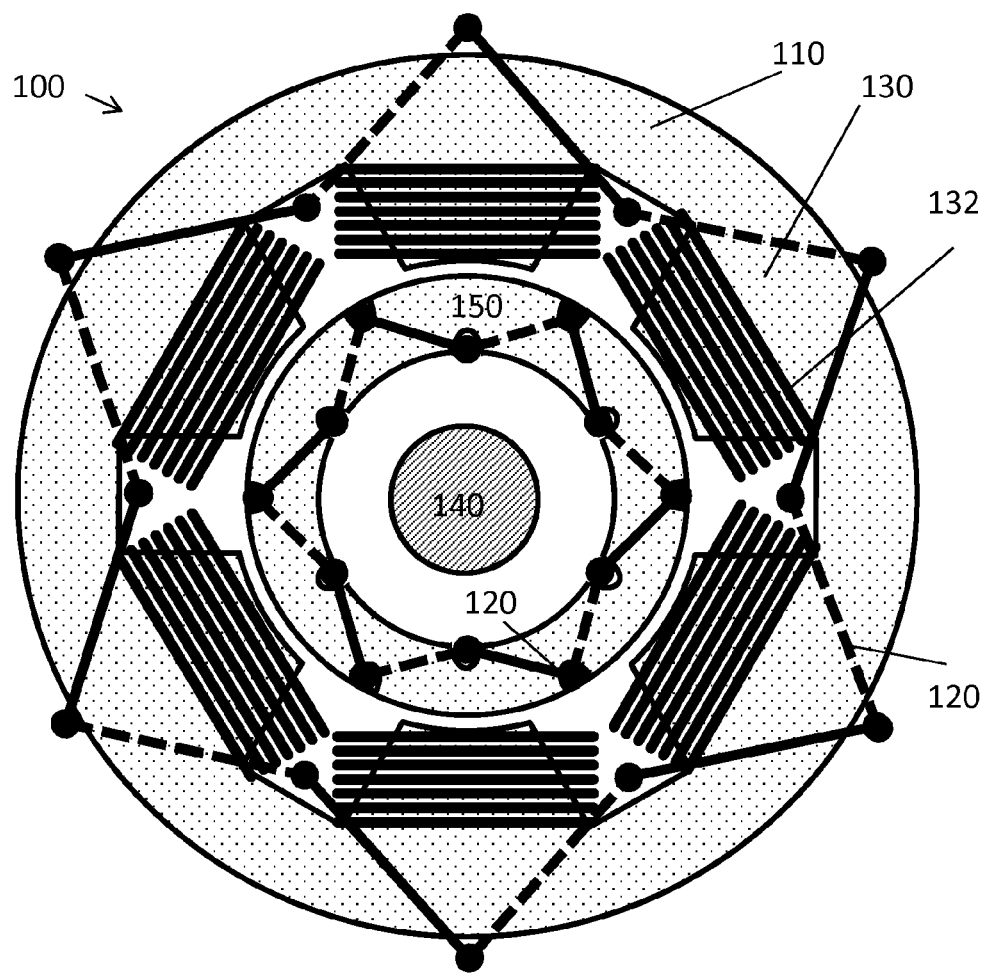

Note that in the configuration of the termination unit as shown in FIG. 1, the same shielding element may be applied to the component 324, holding the magnet configuration of the rotor. The same losses and heating phenomena may apply to this part as well and the shielding element is an effective method of shielding the potential external current while the functionality of the rotor is not being affected substantially. Such a shielding element around the rotor of a motor is also illustrated in FIG. 5.

In embodiments of the present invention the termination unit may for example be a PVD source termination unit. Since PVD deposition of a target can generate a lot of heat on the target surface, this surface needs to be cooled. This is typically achieved with water on any other suitable coolant. In embodiments of the present invention the termination unit may therefore comprise means for guiding the coolant and seals for sealing the cooling liquid.

A termination unit 300 may comprise bearing means. These may for example support the target while it is turning around its axis. If the current towards the target 350 is carried by the axis of the motor, this current may also pass through the centre of the bearings and cause heating of the electrical steel of the bearings. It is in that case advantageous to these termination units are comprising bearings in accordance with embodiments of the present invention.

In embodiments of the present invention the termination unit may moreover comprise means to position a magnet or a series of magnets in the target 350. These may be bearing means for supporting the magnet or series of magnets and/or driving means for generating a rotational movement.

A termination unit also may comprise sealing means. A dynamic seal thereby typically comprises metal rings for sustaining the cylindrical shape of the seal.

In embodiments of the present invention, such as in the exemplary termination unit of FIG. 1 and FIG. 2, the termination unit comprises a current transfer means that carries a unipolar current through a component comprising electrical steel. The latter component is used for applying a rotational movement to the target (or to the magnetic bar) connected to the termination unit. This current transfer means is electrically isolated from the device 100 (e.g. from the motor, bearing or supporting structure) in order to enforce the current as a unipolar current through the component containing electrical steel.

Due to the presence of a unipolar current through the component comprising electrical steel, this unipolar current will act as a magnetizing current and generate a magnetic induction inside the electrical steel. This ring flux will not necessarily interfere with the magnetic topology of the functional behavior of the rotational component, but some major effects will result:

The magnitude of this unipolar current can be significantly high and be one or two magnitudes larger than the active current in the rotational component. This may result in a magnetizing current that mostly saturates the magnetic steel.

The frequency content of the unipolar current in a termination unit may for example be in the mid frequency range from 10 kHz up to 100 kHz and may strongly differ from the frequency of the currents generating the contributing magnetic field. These currents may for example be in the frequency range from 5 to 100 Hz. The loss properties of the magnetic steel are optimized for the frequency range from 50 to 100 Hz but are mostly unsuited for frequencies from 10 kHz to 100 kHz. Moreover, selecting electrical steel that is suited for frequencies from 10 to 100 kHz is not possible as this kind of material does not exist or is extremely expensive. Hence, in practice, major magnetic losses will result inside the electrical steel, that will present major thermal problems in the termination unit.

This implies that the shielding element (e.g. shieling winding) according to embodiments of the present invention, which mitigates the induced flux created by the termination unit current transfer means, is preferably designed based on the nature of the transferred current. To generate a counteracting field for the field generated by the current in the current transfer means, the active section of the shielding winding may be thicker than the thickness required for mitigating asymmetric magnetic fields created by stator asymmetries. The mid frequency range from 10 kHz up to 100 kHz, might require the use of high frequency Litze wire, to lower the AC resistance of the wire. A reduced AC resistance will result in a reduced voltage drop over the shielding element (e.g. winding). The total voltage drop (product of induced current and the AC resistance) is preferably below 1.0V to limit the losses inside the electrical steel. This is advantageous because the resulting voltage drop will be in correspondence with a generated ring flux inside the electrical steel. Preferably a shielding element (e.g. winding) is realized with a low leakage flux.

In embodiments of the present invention the shielding element is configured such that when a neighboring varying current (having the first topology) would be applied which results in a varying non-contributing magnetic field through the electrical steel, which is not contributing to the function of the device, this varying non-contributing magnetic field results in a net magnetic flux through the shielding element, and this neighboring varying current results in a current through the at least one shielding element which counteracts the non-contributing magnetic field. The neighboring varying current may be carried by a neighboring current transfer means having the first topology.

In embodiments of the present invention the shielding element is a shielding winding. The shielding winding can for example be a single wire (being of any shape), a woven cable, a non-woven cable or a Litze cable.

In embodiments of the present invention the neighboring current transfer means may be next to the component comprising electrical steel or it may go through the component comprising electrical steel.

Electrical steel thereby is an iron alloy. It may be tailored to produce specific magnetic properties such as a small hysteresis area resulting in low power loss per cycle. The electrical steel may comprise other materials like ferrites, laminations, and high permeability materials.

In embodiments of the present invention the power loss may be caused by an alternating non-contributing magnetic flux density and is reduced by reducing this flux density compared to the situation wherein no shielding winding would be present.

In embodiments of the present invention the non-contributing magnetic field may be generated by an external current not intended to contribute to the useful operation of the device. The current may for example flow over a current carrying conductor 140. The current carrying conductor may be in the neighborhood of the electrical steel component. This means it may be next to the electrical steel component or it may be surrounded by the electrical steel component.

If such a current carrying conductor is surrounded by a hollow cylinder of electrical steel, this will result in losses. There are 2 main terms in the losses inside the electrical steel. Hysteresis losses and eddy current losses due to the thickness of the elements that constitute the electrical steel and the electrical conductivity of the magnetic steel (cfr. Lamination thickness).

$$\begin{cases} P_{hyst} \cong f \cdot B^2 \\ P_{eddy} \cong f^2 \cdot B^2 \end{cases}.$$

Herein f is the frequency of the magnetic field variation and B is the magnetic flux density. This may be caused by an external current not contributing to the useful operation of the device. As B is proportional to the current in the non-saturating working domain of the electrical steel, the losses will be proportional to the square of the current.

Commercial electrical steel is defined by a simple single loss number [W/kg] for a given magnetic flux density at 50 or 60 Hz. This makes it difficult to extrapolate the frequency behavior of the electrical steel at much higher frequencies or a combination of a set of higher frequencies.

In embodiments of the present invention the magnetic field is transferred from one side of the component comprising the electrical steel to the other side, creating the effect as if no electrical steel is present for the external current not intended to contribute to the useful operation of the device.

In embodiments of the present invention the at least one component 110 comprising electrical steel is adapted for guiding a contributing magnetic field for operating the device 100. This may for example be the case for a transformer or a motor. The at least one shielding winding is positioned such that substantially no net integrated magnetic flux through the shielding winding originates from the contributing magnetic field. In embodiments of the present invention the potential presence of a non-contributing magnetic field has a flux path that is different from the contributing field.

In embodiments of the present invention the at least one shielding winding may be short circuited or it may be loaded by an impedance. This may for example be a resistance, a capacitance, an inductance, or a combination of these elements.

In embodiments of the present invention the device 100 is a motor. Such a motor may for example be a DC motor, an AC motor, a servo-motor, a stepper motor, a brushless DC motor, a reluctance motor, a torque motor.

Figure 3:
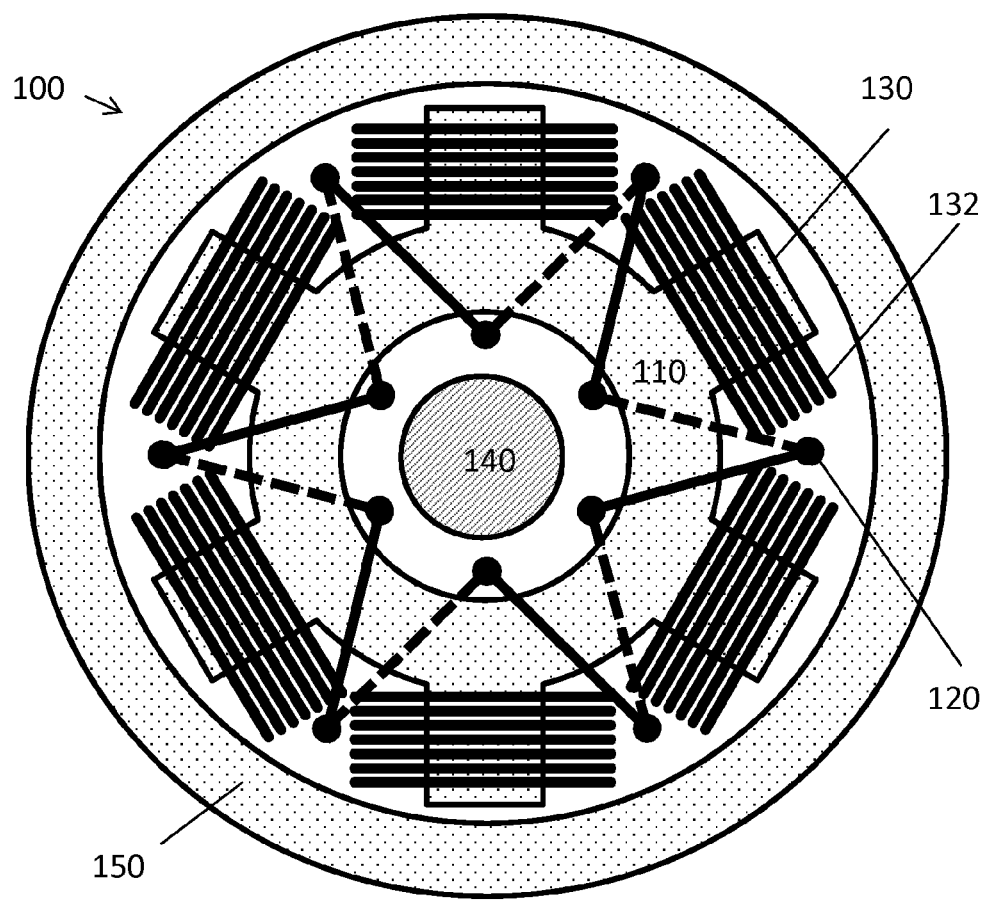
FIG. 3 shows a schematic drawing of a motor with an external rotor in accordance with embodiments of the present invention.

A schematic drawing of such a motor with an external rotor 150, in accordance with embodiments of the present invention, is shown in FIG. 3. The figure shows the component 110 comprising electrical steel (which corresponds with the stator) and the at least one shielding wiring 120 which is toroidally wound around the stator. In this example the shielding wiring 120 is wound between the teeth 130 of the stator. The motor windings 132 for operating the motor are wound around the teeth 130 of the stator. FIG. 3 also shows a central axis 140 which can be used as current transfer means for a potentially external current of another electrical circuit. This external current is not related in any way to a useful operation of the motor, but this current path is preferentially used because of geometric and technical reasons. The rotor 150 is only schematically drawn for indicating its position in the motor. The permanent magnets (when present in the motor) are for example not shown in this and the following figures.

A similar embodiment can be found with the rotor 150 at the internal side of the stator 110 in FIG. 2. Also in that case, a conductor 140 can be present inside the rotor that is used as a conducting means for a potentially external current. This conducting path could be as well the outside surface of the rotor. The rotor itself may be a component comprising electrical steel and a shielding element 120 may be configured such that a varying current through the neighboring current transfer means 140 results in a current through the shielding element 120 which results in a magnetic field which counteracts the non-contributing magnetic field. This is illustrated in FIG. 5 wherein the shielding element is a shielding winding 120 toroidally wound around the rotor 150.

Figure 4:
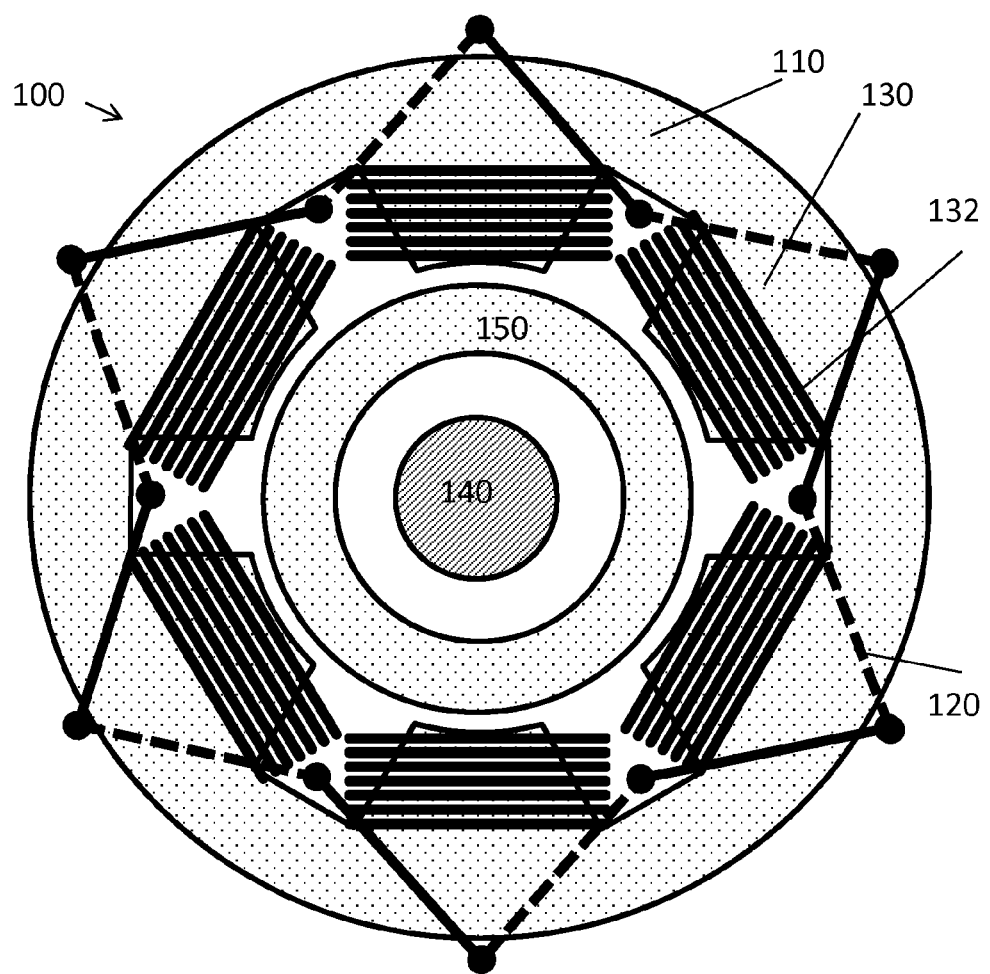
FIG. 4 and FIG. 5 show the schematic drawing of a motor with an internal rotor in accordance with embodiments of the present invention.
Figure 6:
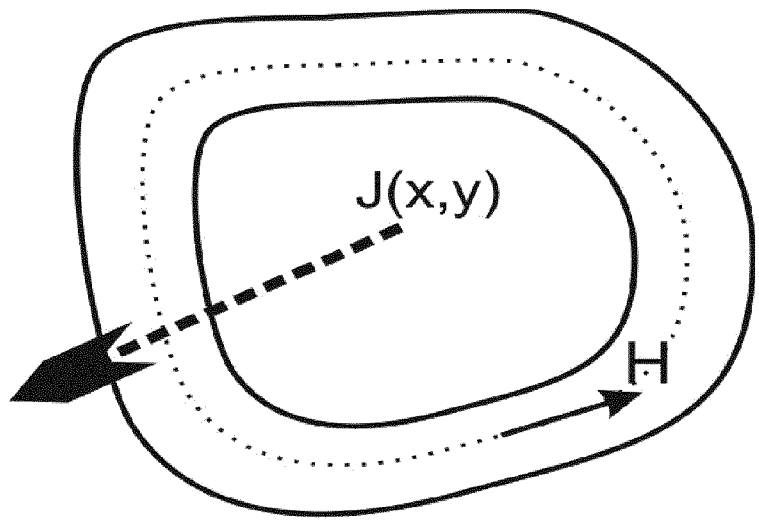
FIG. 6 shows the cross section of electric steel with the presence of a current density through its internal perimeter.

In the examples in FIGS. 3 to 5 the potentially external current through the conductor 140 that acts as an unwanted magnetizing current for the electrical steel is of a kind that it is a unipolar current. This means that the surface integral of the current density within the internal perimeter of the magnetic steel (as shown in FIG. 6) is non-zero:

$$I_{total} = \int\int_{surface\ internal\ perimeter} J(x,y) dx dy \neq 0.$$

So, in these examples the current has a unipolar character. When this total surface integral equals zero, then this is because an equal amount of current flows back inside the perimeter of the electrical steel. This is then in fact a two-conductor system with an entry and return conductor.

When dealing with a potential unipolar current that flows through the internal perimeter of the electrical steel, then the return current will be physically located outside the external perimeter of the electrical steel and mostly, outside the electromagnetic device that comprises the electrical steel.

According to Ampère's law, the line integral of the magnetic field over a closed curve inside the magnetic steel, is related to the total current density of the potential external current that flows within the perimeter of the electrical steel internal surface (FIG. 6):

$$\oint_{inside\ magnetic\ steel} H_{steel} \cdot dl = \iint_{surface\ internal\ perimeter} J(x,y) dx dy$$

When dealing with a unipolar current, the line integral of the magnetic field H is not zero inside the magnetic steel and hence, in relation to the magnetic properties of the material, a magnetic flux density is created related to the magnetic permeability $\mu_r$ of the material (which can show saturation effects, denoted by using the notation $\mu_r(H)$)•:

$$B_{steel} = \mu_0 \mu_r(H) \cdot H_{steel}$$

The created magnetic flux density $B_{steel}$ is responsible for extra losses inside the electrical steel due to hysteresis losses and eddy current losses, as can be found in the datasheet of all ferromagnetic materials. The frequency content of the potential external current can be of such a kind that it is not favorable for the type of electrical steel used. Mostly, the type of electrical steel is selected based on the working frequency and the level of the magnetic flux density in the air gap of the motor (situated between the stator teeth and the rotor electrical steel or permanent magnets when present on the rotor). The frequency content of the non-contributing field can be largely different from the frequency content of the flux density present for the torque generation in the motor. And this can be very unfavorable for the properties of the electrical steel.

Note that, in the example of a motor, the magnetic flux density generated by a potential external unipolar current is of such a kind that in general, it will not transverse the air gap between the stator and the rotor structure. It will not directly interfere with the magnetic field, used for the motor operation. Indirectly however, it can add saturation to part of the stator steel, reducing the overall permeability $\mu_r$ of any practical magnetic steel and hence, this can influence the magnetic flux density generated by the stator windings and reduce the motor torque. Furthermore, due to the extra losses generated by the potential external current, the temperature of the electrical steel will rise and in general, this will reduce the magnetic permeability of the steel, resulting in a torque reduction of the motor for a given stator current.

The potential (unipolar) external current can be a combination of a direct current (DC component) and an alternating component (AC component), showing a magnitude on the spectral content, linked to the nature of the application of the external circuit. The DC component of the potential external current will not create hysteresis and eddy current losses inside the electrical steel of the motor, as the frequency of the created magnetic flux density equals zero Hertz. Indirectly, it will create a magnetic field H inside the electrical steel, that will superimpose on the magnetic field created by the stator winding inside said magnetic structure. As a result, higher values of the magnetic flux density might result on local positions, where the contributing and the non-contributing flux share equal paths, resulting in a less efficient use of the magnetic properties of the electrical steel and hence, generate more losses in combination with the always alternating behavior of the motor magnetic field.

Figure 7:
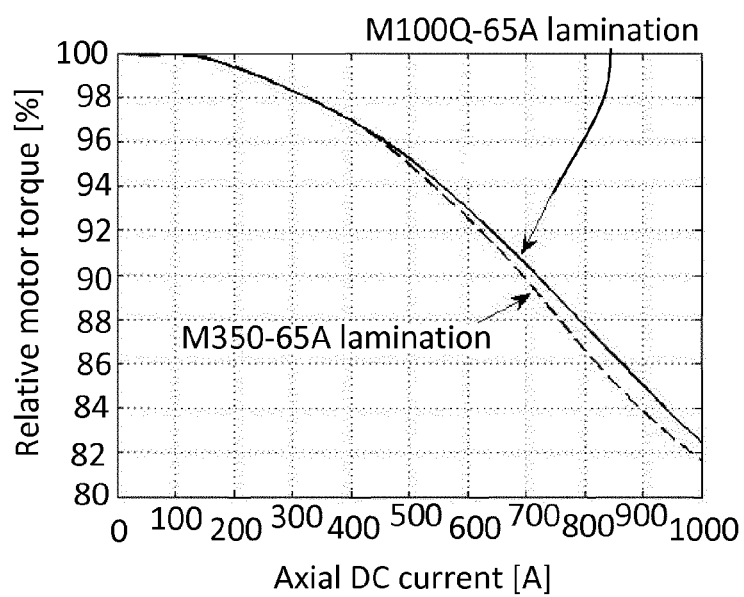
FIG. 7 shows the influence on the effective motor torque due to the presence of an external DC current through the internal perimeter of a stator.

Practical tests on a motor with a stator having an internal diameter of 90 mm, showed a reduction in the effective motor torque, as illustrated in FIG. 7. For moderate axial currents, this torque reduction can be acceptable and it can be compensated by providing a larger designed motor torque. Therefore, for many situations, the presence of moderate external DC currents, non-contributing to the magnetic field for the motor operation, does not show major problems.

When major potential external DC currents can be present, then some techniques must be applied to reduce the H-field inside the electrical steel. Note that this automatically will also reduce the alternating component of this H field and hence, gives a reduction of the magnetic losses inside the bulk of this material. This reduction of the magnetic field can be accomplished in several ways:

Use of electrical steel having anisotropic properties, so that the magnetic field of the potential external current uses a less favorable direction inside the magnetic steel, having a lower value for the anisotropic permeability. The orientation of the electrical steel should be of such a kind that it favors the flux density related to the motor operation. Of course, in locations where the motor field and the field generated by the potential external current are of the kind that both have the same direction, then no improvement can be reached at those locations inside the bulk of the electrical steel.

Figure 8:
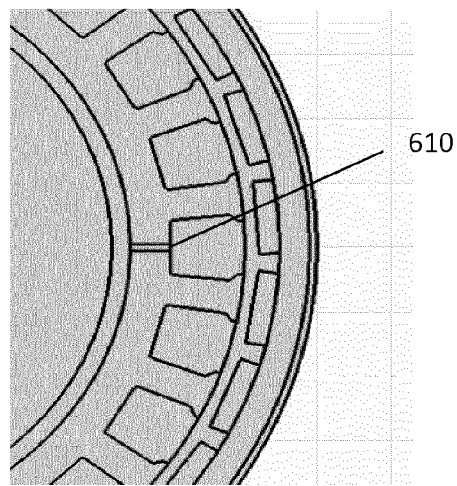
FIG. 8 shows the schematic drawing of a motor comprising a stator with a slit filled with air in the central part of the electrical steel.

Built in of extra magnetic reluctance by the introduction of an 'airgap' in the external applied current's flux path inside the electrical steel that diminishes the external flux density generated by the effect of a potential external current, but shows only a limited interference with the magnetic flux path of the motor operation. Such an airgap (610) is for example illustrated in the schematic drawing of the motor in FIG. 8. This is also an effective way of reducing the AC component of the flux density generated by the external current and hence, helps to reduce the losses inside the electrical steel.

Built in of extra magnetic reluctance that in particular affects the AC component of the magnetic flux density generated by the potential external current. This can be accomplished by adding a non-magnetic conducting material inside the 'airgap' of the added reluctance in the process of segmentation. The thickness of the shielding conductor inside the added airgap, should be at least several times the skin thickness for the given frequency content of the potential external current (FIG. 8, e.g. slit filled with an isolated solid copper conductor).

Adding magnetic reluctance inside the continuous core of the stator is an effective means in reducing the flux density generated by a potential unipolar external current, traversing the internal perimeter of the electrical steel. This can be seen from the equations that result when adding an airgap in the flux path inside electrical steel.

Figure 9:
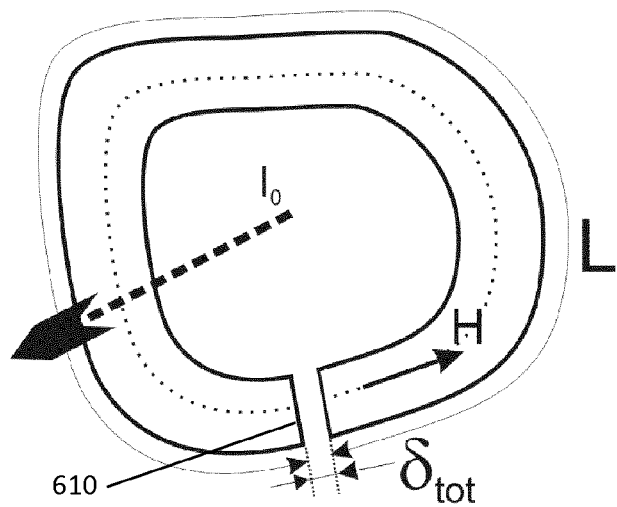
FIG. 9 shows the cross section of electric steel comprising a slit in the electrical steel.

Consider a circumferential part of electrical steel that has a total average circumference L (FIG. 9). When the total airgap (610) added into this circuit has a length $\delta_{tot}$, then for a central conductor carrying a current $I_0$, the magnetic flux density can be written as:

$$B_{steel} = \frac{\mu_0 \mu_{r(steel)} I_0}{L + \mu_{r(steel)} \delta_{tot}}$$

So, in practice, when the physical airgap added by reluctance equals $\delta_{tot}$, then the magnetic airgap equals $\mu_r \delta_{tot}$, with $\mu_r$ being a large number for practical materials. As a result, this will strongly diminish the non-contributing magnetic flux density generated by the potential external current and hence, this will mean a strong reduction of the losses in the electrical steel. So, adding reluctance in the continuous structure of the stator (or the rotor) is a solution for diminishing the losses problem generated by a potential external current, penetrating the internal perimeter of the electrical steel. For the example depicted in FIG. 8, it was found that the flux density in the electrical steel generated by the external current, reached a value of 1.48 T for a given external current value. When a single slit width of 1 mm was introduced in this stator core, cutting the stator core completely (FIG. 8), then the flux density dropped to 0.7 T, which is a reduction of more than 50% for the flux density and accordingly, a reduction of 75% on the magnetic losses in the stator in the case of an alternating current.

Figure 10:
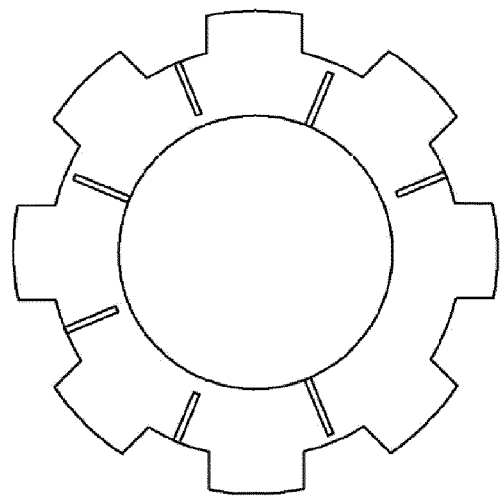
FIG. 10 shows an example of a stator cross section with open slits added in the material, in order to add magnetic reluctance that is situated in the major flux path of the magnetic field, not contributing to the useful operation of the motor.

Magnetic reluctance can be added into the electrical steel of a stator by introducing at least one 'airgap' or slit (filled with a non-magnetic material that can be conducting, but should be isolated from the electrical steel if the latter is conducting). As a complete cut-out in the core of the electrical steel (FIG. 8), can jeopardize the mechanical stiffness of the stator, partly slits can be made to create the same effect (FIG. 10). As an alternative, when electrical steel consists of a stacked lamination assembly, it can be stacked in such a way that slit is located for many laminations at the same position, and then subsequent stacking can rotate the slit location to another location. This process can be done several times. When everything is fixed together, some substantial mechanical stiffness will result.

One disadvantage of adding reluctance by introducing airgap slits inside the stator structure, is that it affects the structural and mechanical properties of the whole stator structure and hence the electromagnetic device in general. The built-up of the electrical steel becomes more difficult and hence, more expensive. Also, in most cases, the reduction of the magnetic flux density inside the magnetic steel and being created by the potential external current, can be sufficient for the DC current, but can be insufficient for the AC component of the field, resulting in the end in too much magnetic losses after all.

Another solution for this problem might be found on physical grounds by implementing a massive shielding, similar to the principle of the Faraday cage, around the parts containing the electrical steel. The thickness of the shielding material should be at least three times the skin depth of the surface currents, as determined by the frequency content of the potential external alternating current. In that situation, no alternating magnetic field will be found at the inside of the closed shielding, hence no losses will be present in the electrical steel. Note that the potential external current can pass through the shielded electrical steel as a unipolar current. In that case, a donut based hole must be provided in the shielding, so that the conductor with a unipolar current can pass through the shielding, the latter still forming a closed structure. The external return current is found in a conductor outside the shielded structure.

The use of a Faraday cage to protect the electrical steel, in practice, shows some major problems, e.g. when dealing with an electromagnetic device that acts as a mechanical actuator:

The contributing magnetic field of the motor, which is of an alternating nature, should not be mitigated by the enveloping Faraday shield. The magnetic field between the stator and the rotor can therefore not penetrate the shielding structure. This means that the shielding should surround both the stator and the rotor structure, so that no integrated change of flux by the contributing field can be found over the surface of the shield.

The mechanical power generated by the rotor of the motor should be transferred outside of the enveloping shield. This can only be realized by providing a mechanical feed-through in the shielding structure, giving a discontinuity in the electrical conduction on the shielding surface. In most cases, this will give a major loss of shielding effectiveness. The problem can be solved by providing a moving part in the shield that has a continuous electrical connection with the fixed part of the shield, e.g. by implementing the use of brushes or sliding contact parts.

The practical implementation of a closed Faraday cage around the motor is in practice expensive and shows many technical problems due to the mechanical feedthrough for the mechanical motor power. The nature of a Faraday shielding is also very universal: it will shield the presence of every external current from the electrical steel at the inside of the shielding structure. In practice, the shielding is preferably only effective for a specific topology of the conductors carrying the potential external non-contributing current.

Therefore, in embodiments of the present invention the shielding element is configured such that it only counteracts the non-contributing magnetic field, but does not affect the contributing magnetic field of the motor. In this way, the shielding element can be confined to a fixed part on the stator and on the rotor only, removing the problem of the mechanical feed-through in the Faraday shielding.

In embodiments of the present invention the device is a motor and the current transfer means is a conductor along the central axis of the motor which is adapted for carrying a current for powering an external device. The varying (e.g. alternating) part of this current has the properties that it will create unwanted excessive magnetic losses (hysteresis losses and eddy current losses) inside the electrical steel.

In embodiments of the present invention the at least one shielding element (e.g. winding) is applied such that it does not counter-act the magnetic field of the normal motor operation (hence the motor windings do not induce voltages in this at least one shielding winding), but opposes the field created by the central axial current component. In embodiments of the present invention the at least one shielding winding is short-circuited, so that by definition, no magnetic field can be built-up for the flux density created by the potential external current. In practice, this alternating non-contributing magnetic field is strongly reduced because of the presence of the at least one shielding winding, and this results in a major drop of the magnetic losses inside the electrical steel as this is proportional to the square of the magnetic flux density.

Figure 11:
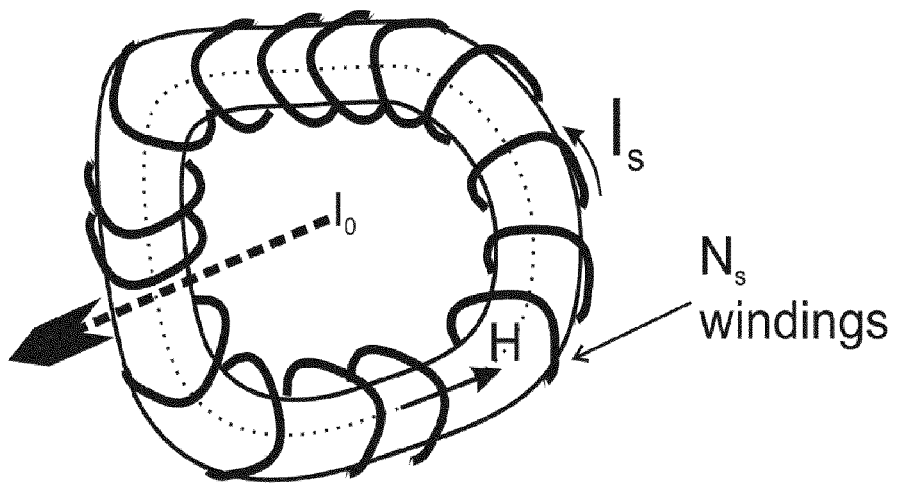
FIG. 11 shows the principle of a shielding wire that will counteract the induced magnetic field in the electrical steel, due to the presence of a potential external magnetizing current, in accordance with embodiments of the present invention.

If the total winding count for the shielding wire equals $N_s$ and if the external potential current has a value $I_0$, then in practice, the current $I_s$ in the shielding wire will compensate the applied external current $I_0$ (FIG. 11):

$$I_0 = N_s I_s,$$

But the sign of the current $I_s$ of that kind that it will counteract the external current $I_0$. Applying Ampères law for calculating the H-field in the electrical steel, when an external current and the shielding winding is present results in:

$$\oint_{inside\,magnetic\,steel} H_{steel} \cdot dl = \iint_{\substack{surface \\ internal\ perimeter}} J(x, y) dx dy = I_0 - N_s I_s = 0$$

In practice, $H_{steel}$ will not become zero, as a voltage drop is present over the shielding winding. This voltage drop will present itself as some valued magnetic flux density that will be present in the electrical steel, created in the end by the potential external current.

The elements that determine this voltage drop over the shielding winding are:

The resistive voltage drop over the shielding winding's resistance, according Pouillet's law. This voltage drop is directly related to the current in the shielding wire $I_s$ and the wire resistance.

As the nature of the potential external current is an alternating current, the shielding current $I_s$ has therefore also the same alternating nature and the skin effect might be present in the winding material, increasing the effective resistance of the shielding wire, as the current flow is confined to the circumference of the solid wire part. The skin effect is extensively described in literature and technical reports. When the shielding wire consists of several wires, then the proximity effect will be present as well.

The shielding wire current $I_s$ will in practice also create a magnetic flux density in parts of the air around the physical location of the shielding wire. This means that some inductive energy is stored in the winding that is not linked to flux density in the iron steel. This is well known in literature as leakage flux. Due to the alternating nature of the current in the shielding winding, a voltage drop will result due to the presence of this leakage flux.

As the flux density generated by the potential external current is not fully suppressed by the shielding winding, due to a parasitic voltage drop over this winding, some minor losses still will be present in the electrical steel.

In embodiments of current invention, at least one shielding wire can be loaded by an electrical impedance. This is a parallel or series combination of capacitors, inductors, resistors. For example, the effect of leakage inductance of the shielding wire can be compensated by adding a series capacitor in the shielding winding, which is tuned to the working frequency of the potential external current. This will lower the voltage drop over the shielding wire and hence, lower the losses generated by the external current.

In embodiments of the present invention, the type of shielding winding may be selected based on the frequency content of the potential external current that will be applied. For very low frequencies, a solid thick wire can be used, having a very low ohmic resistance. For mid and high frequency ranges, a braided wire or Litze wire can be used, having a large surface area, being little influenced by the skin effect.

In embodiments of the present invention (e.g. in a motor), the winding is applied such that it counteracts the potential external magnetizing current (e.g. through a central conductor) by using a kind of toroidal winding around the core. A "kind of" hereby refers to the fact that the winding may be adjusted from its toroidal shape so that it fits in a certain position of the component comprising electrical steel. It may for example be positioned between the teeth of a stator.

Figure 12:
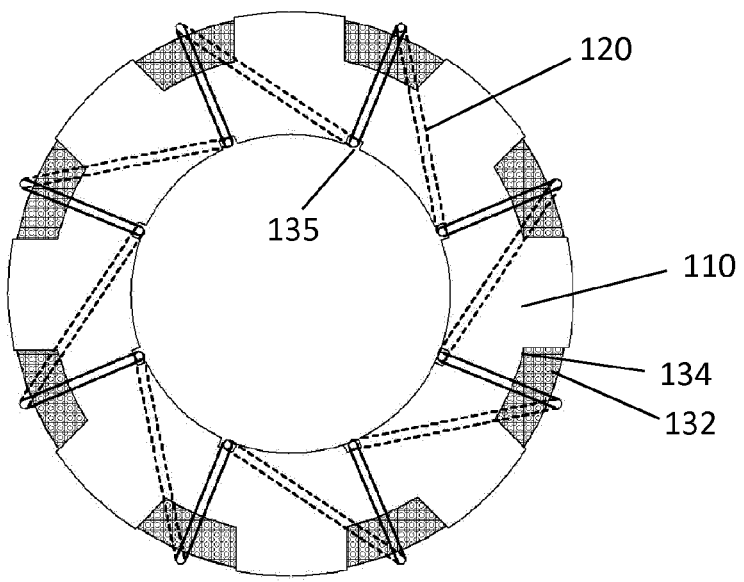
FIG. 12 shows the practical implementation of the shielding winding on the stator with slots provided at the inside of the stator and the shielding wiring returning over the stator winding in accordance with embodiments of the present invention.

In the exemplary embodiment illustrated in FIG. 12 the shielding winding passes over the inner surface of the stator and then returns over the slot of the stator at the outside. FIG. 12 shows the component 110 comprising electrical steel, which in this example is a stator, the slots 134 with therein the stator windings 132, and the shielding winding 120.

Figure 13:
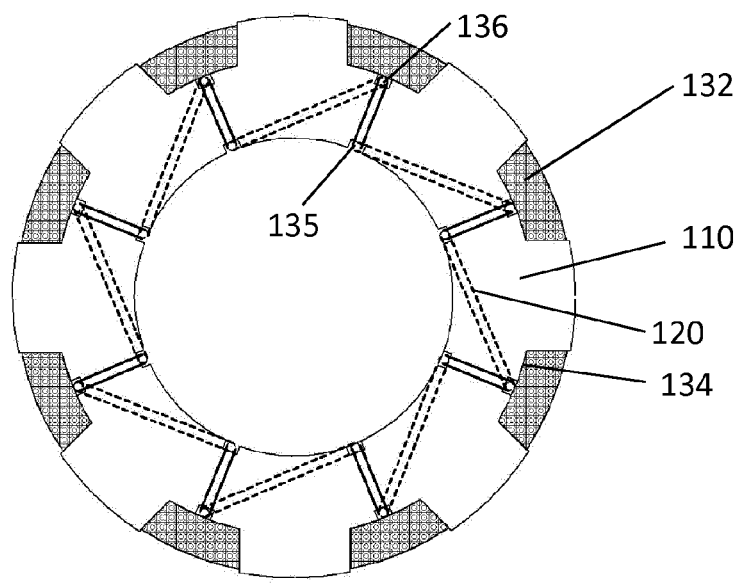
FIG. 13 shows the practical implementation of the shielding winding on the stator of a motor with slots provided in the electrical steel to house the shielding winding, in accordance with embodiments of the present invention.

In embodiments of the present invention, for sake of reducing the leakage inductance of the shielding wire, extra slots 135 can be provided at the inside the stator (FIG. 12 and FIG. 13). A further reduction of the leakage flux can be achieved by providing an extra slot 136 at the outside of the stator, beneath the winding slots 134 (FIG. 13). Of course, the addition of extra slots in the stator will diminish the effective magnetic area of the electric steel, but it can give manufacturing benefits as the shielding winding is located at well-defined position. Apart from slots or recesses, holes can be used as well.

In the example of a 3-phase motor the sum of the current of the three phases that supply the stator is at every moment, equal to 0 A. In practice, this means that the sum of the magnetic field, generated by the three-phase current, will be zero. So, if a complete toroidal shielding winding is applied over the stator through all the slots, then the net magnetic flux through the shielding winding originating from the operational magnetic field is substantially zero. Hence, the shielding winding will not interact with the motor windings.

Figure 14:
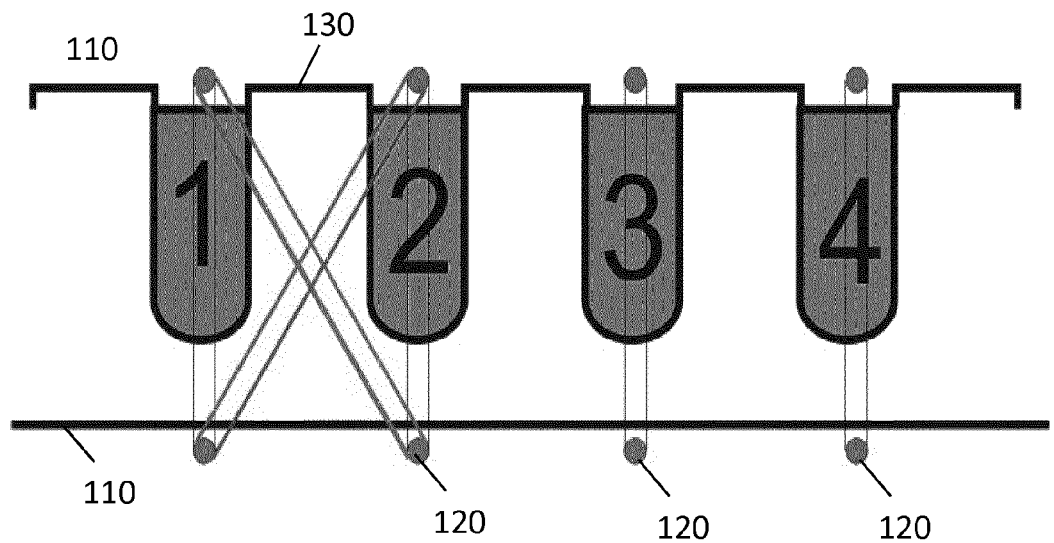
FIG. 14 shows a schematic drawing of a part of a stator comprising electrical steel wherein possible locations of shielding windings are indicated, in accordance with embodiments of the present invention.

FIG. 14 is a schematic drawing of a part of a stator comprising electrical steel wherein possible locations of shielding windings are indicated. In this example the slots are indicated by references 1, 2, 3, 4. In this example a cross-winding is made where the shielding winding of slot 1 and slot 2 are connected together. In embodiments of the present invention a shielding winding may extend to 3 or 4 or more slots. In embodiments of the present invention the position (comprising the number of windings of the shielding winding) can be determined based on the current pattern for operating the motor in order to prevent an interaction with the motor current. Thereby the shielding winding should be positioned such that substantially no net magnetic flux through the shielding winding originates from the contributing magnetic field.

If a cross winding is made over slot 1 & 2, then no current will be induced when the total integrated current over slot 1 & 2 equals zero under all conditions. In embodiments of the present invention a toroidal winding may comprise a plurality of windings enclosing 2 or more, or even all slots of the stator. When the sum of the current in all slots being covered by the shielding winding, equals zero, substantially no net flux will be generated in the shielding. Hence, the motor operation will not be influenced by the presence of the shielding winding.

When a set of neighbouring slots can be found that after summation of the Ampère windings results in zero amps, then the shielding winding can be locally applied to cover these slots. The same approach can be followed for the remaining stator slots. So, this means that a single toroidal winding can always be replaced by a set of individual toroidal windings, that cover a limited segment of the stator. But each of these shielding windings needs to be a closed loop. In embodiments of the present invention the wires are shorted or a load impedance is added (in order to enhance the behaviour of the shielding wire). In an exemplary embodiment of the present invention, it is easier to use a single shielding wire, as the return conductor between the start and the end of the shielding winding will be relatively short.

The effect of the shielding winding is not limited to reducing the magnetic losses in the electrical steel as such. Moreover, almost no energy will be stored in the electrical steel due to a field not contributing to the motor operation of the device. Due to the shorted shielding winding, the stator flux generated by the potential external alternating current will be small (in accordance with the voltage drop over the shielding winding, which is kept small by design). So, this results in a low magnetic energy storage and the physical effect seen by the circuit that contains the external electrical current is that the leakage induction will be small. When dealing with varying (e.g. alternating) currents, this means that the voltage drop over the conductor, passing through the perimeter of the electrical steel, will also remain small.

Another benefit of the shielding winding is that this shielding winding can also be used for shielding the effect of the presence of a potential external DC current. The presence of an external DC current ($I_{dc}$) will have no effect on the shielding winding as according Lenz's law, no voltage will be induced in the shielding winding. But by external means, it is possible to inject a DC current $I_{sdc}$ into the shielding winding. If the value and the sign of $I_{sdc}$ is choosen so that:

$$I_{dc} - N_s I_{sdc} = 0,$$

Then no DC non-contributing magnetising field will be present in the electrical steel. So, magnetizing effects of the electrical steel and even saturation of the material will be prevented by applying an external DC current in the shielding winding. As the resistance of the shielding wire is low for a DC current, the supply of a compensating current $I_{sdc}$ will not be much energy demanding and can be considered as a means for counteracting the non-contributing field of a potential external DC current. Devices according to embodiments of the present invention may comprise a controller for generating such a current.

Figure 15:
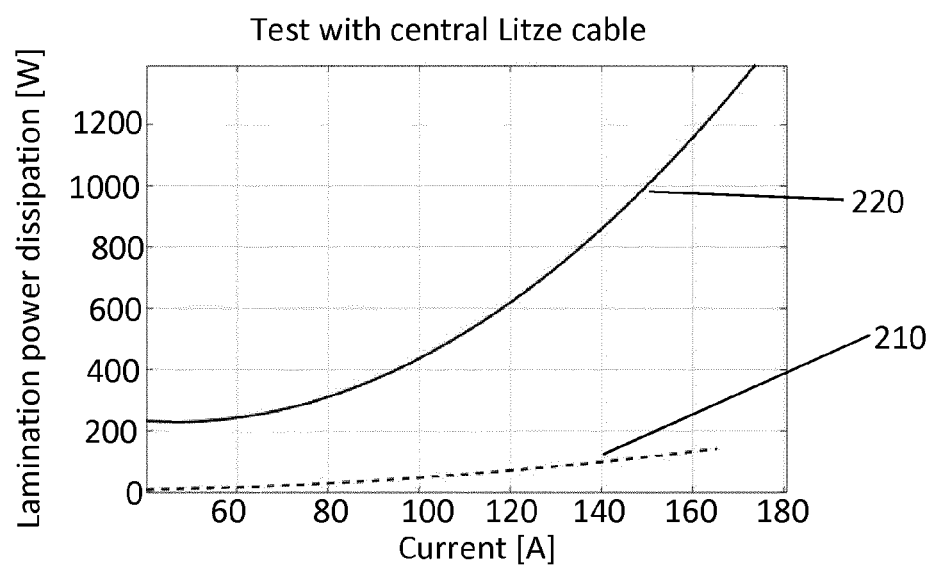
FIG. 15 shows the power loss in the stator comprising the power loss in the supply cable of the external current, when the shielding winding is open and when the shielding winding is closed, in accordance with embodiments of the present invention.

FIG. 15 shows the losses in the stator when the shielding wire is active (210) and not active (220) (by simply opening the shielding wire circuit). The input current goes in the range from 5 to 160 A and did have a frequency of 40 kHz. As can be seen the losses are significantly decreased when the shielding wire is active.

Figure 16:
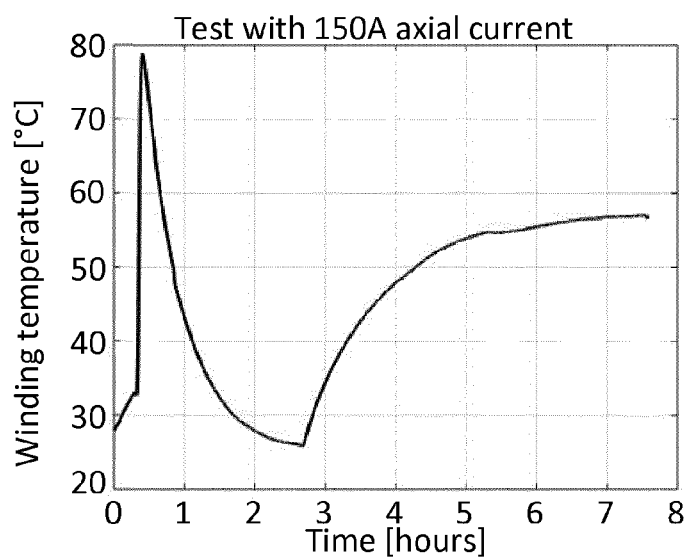
FIG. 16 shows a curve wherein the electrical steel temperature is shown in function of time for a prior art device and for a device in accordance with embodiments of the present invention.

In FIG. 16 the difference between an active shielding wire circuit (short circuited shielding winding) and an inactive shielding wire circuit (open shielding winding) is illustrated. FIG. 16 shows a curve wherein the electrical steel temperature is shown in function of time. The curve is obtained when applying an alternating axial current of 150 A. In the first half hour the shielding winding was open showing a steep increase of the electrical steel temperature. When a temperature of almost 80° C. was reached the experiment was stopped in order not to overheat the stator windings. Next the shielding winding is short circuited. After a cool-down period, the alternating axial current of 150 A is applied again. Now, the shorted shielding wire will counteract the flux density created by the axial current in the electrical steel. The limited temperature rise of the electrical steel is now due to the Joule losses in the axial conductor.

Figure 17:
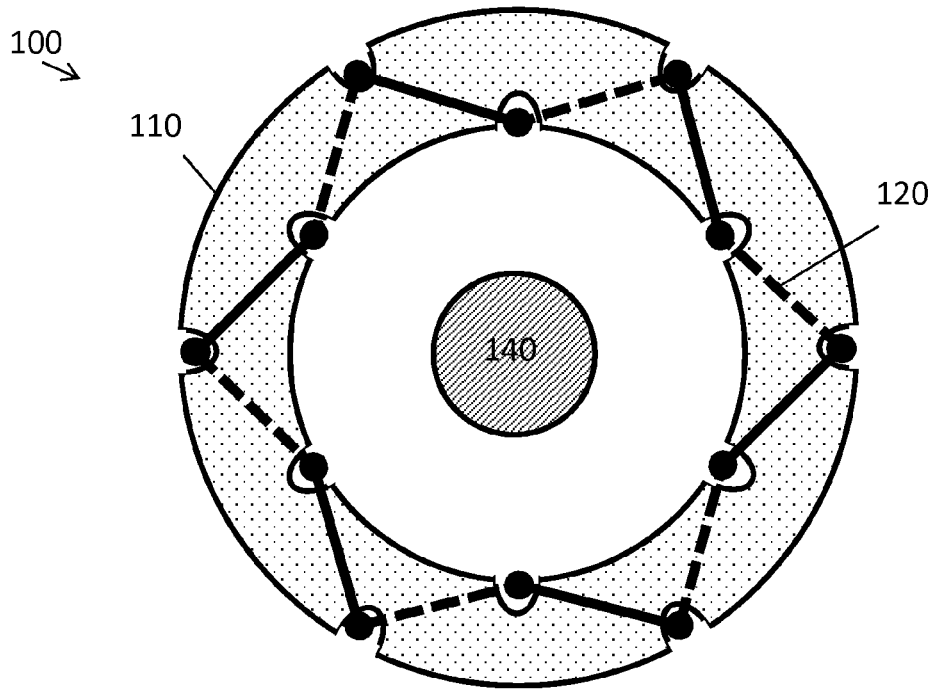
FIG. 17 shows a schematic drawing of a bearing comprising one ring, in accordance with embodiments of the present invention.
Figure 18:
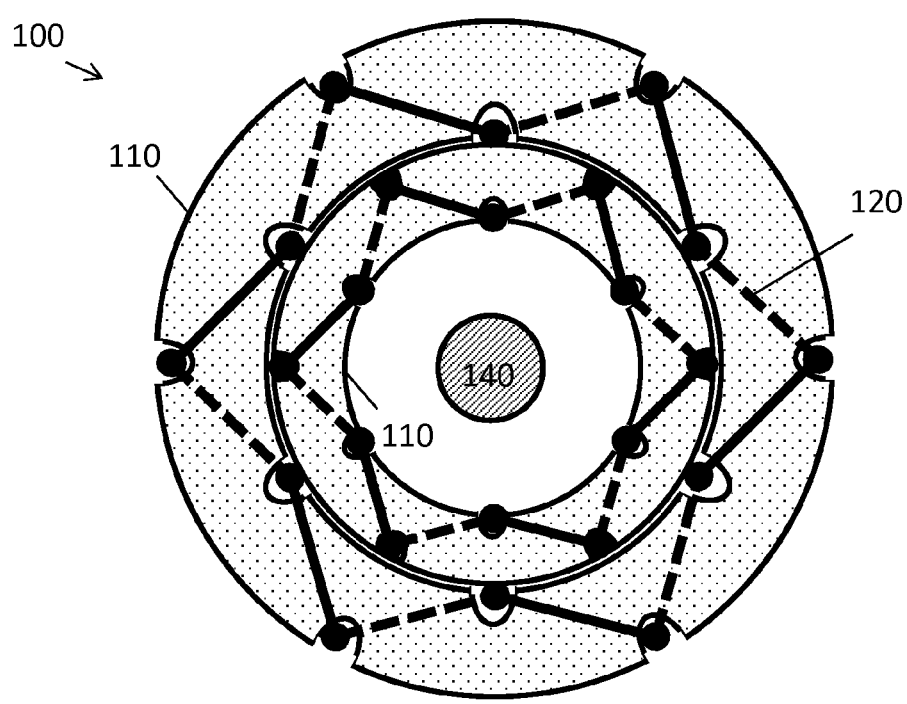
FIG. 18 shows a schematic drawing of a bearing comprising two rings, in accordance with embodiments of the present invention.

In embodiments of the present invention the device is a bearing and the component comprising electrical steel corresponds with a ring of the bearing. An example thereof is schematically illustrated in FIG. 17 and FIG. 18. FIG. 17 shows a bearing with one ring wherein the ring corresponds with the component 110 comprising electrical steel. The shielding winding 120 is toroidally wound around the ring. In this exemplary embodiment of the present invention the shielding winding is sunken in the ring such that it cannot hinder the rotation of the ring. In FIG. 18 a bearing is shown with two concentric rings 110 wherein a shielding winding 120 is toroidally wound around each of the rings. Each winding is mounted sunken into its corresponding ring. A magnetic field in the ring, caused by an alternating current through a central conductor will be compensated for by the presence of the shielding winding. The bearing may be chosen to be appropriate for the specific application and may be of any type known; such as but not limited to ball bearings, roller bearings, plain bearings, axial bearings or any type known in the art.

The invention claimed is:

1. A termination unit for a deposition system, the termination unit comprising:
a device for effecting a function, the device comprising at least one component comprising electrical steel; a stator; a rotor; motor windings; current transfer means, which is not the motor windings; and a shielding element, wherein
the device is an electrical motor, and
the stator and/or the rotor is the at least one component comprising electrical steel,
the motor is configured to apply a current to the motor windings resulting in a contributing magnetic field resulting in a torque force between the stator and the rotor to rotate a target when mounted,
the current transfer means neighboring the at least one component comprising electrical steel,
the current transfer means is adapted for guiding a current according to a first topology and for transferring power to the target when the target is mounted on the termination unit, and
the shielding element is configured such that when a neighboring current with the first topology is applied, an effect of the neighboring current on the at least one component comprising electrical steel is mitigated by a current through the shielding element resulting in a counteracting field in the shielding element.

2. The termination unit according to claim 1, wherein the shielding element is configured such that when a neighboring varying current would be applied which results in a varying non-contributing magnetic field through the at least one component comprising electrical steel,
said neighboring varying non-contributing magnetic field results in a net magnetic flux through the shielding element, and
said neighboring varying current results in a current through the shielding element which results in a magnetic field that counteracts said neighboring varying non-contributing magnetic field through the at least one component comprising electrical steel.

3. The termination unit according to claim 1, wherein the at least one component comprising electrical steel is adapted for guiding a contributing magnetic field contributing to the function of the device,
wherein the shielding element is positioned such that substantially no net magnetic flux through the shielding element originates from the contributing magnetic field.

4. The termination unit according to claim 1 wherein the current transfer means is configured such that the current transfer means crosses a circumference of the at least one component comprising electrical steel, and such that a return path of the current transfer means is outside the at least one component comprising electrical steel.

5. The termination unit according to claim 1 wherein the the at least one component comprising electrical steel has a toroidal shape, and
wherein the shielding element is a shielding winding which is substantially toroidally wound around the at least one component comprising electrical steel.

6. The termination unit according to claim 1 wherein the shielding element is a shielding winding which is short-circuited.

7. The termination unit according to claim 1 wherein the shielding element is a shielding winding which is loaded by an impedance.

8. The termination unit according to claim 1 wherein the shielding element is sunken and/or embedded in the at least one component comprising electrical steel.

9. The termination unit according to claim 1, wherein the device comprises a drive means to generate a rotational movement.

10. The termination unit according to claim 1, wherein the device comprises bearing means.

11. The termination unit according to claim 1, wherein the device comprises sealing means.

12. The termination unit according to any claim 1, wherein the current transfer means is located along a central axis through the device.

13. The termination unit according to claim 1, the device comprises a controller adapted for applying a DC current through the shielding element to generate a non-contributing magnetic field.

* * * * *